United States Patent
Ono et al.

(10) Patent No.: US 8,759,938 B2
(45) Date of Patent: Jun. 24, 2014

(54) SEMICONDUCTOR DEVICE

(71) Applicants: Syotaro Ono, Hyogo (JP); Masaru Izumisawa, Hyogo (JP); Hiroshi Ohta, Hyogo (JP); Hiroaki Yamashita, Hyogo (JP)

(72) Inventors: Syotaro Ono, Hyogo (JP); Masaru Izumisawa, Hyogo (JP); Hiroshi Ohta, Hyogo (JP); Hiroaki Yamashita, Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/685,019

(22) Filed: Nov. 26, 2012

(65) Prior Publication Data
US 2013/0341751 A1 Dec. 26, 2013

(30) Foreign Application Priority Data
Jun. 20, 2012 (JP) ................................. 2012-139012

(51) Int. Cl.
*H01L 23/58* (2006.01)

(52) U.S. Cl.
USPC ........... 257/488; 257/330; 257/133; 257/383; 257/E27.05; 257/E21.337

(58) Field of Classification Search
USPC .......... 257/488, 330, E21.337, 133, E27.055, 257/E21.383
See application file for complete search history.

(56) References Cited

U.S. PATENT DOCUMENTS

| | | | |
|---|---|---|---|
| 6,512,268 B1 | 1/2003 | Ueno | |
| 6,849,880 B1 | 2/2005 | Saito | |
| 7,910,411 B2 | 3/2011 | Miyajima | |
| 2006/0124997 A1* | 6/2006 | Yamauchi et al. | 257/330 |
| 2008/0001217 A1* | 1/2008 | Kawashima | 257/330 |

FOREIGN PATENT DOCUMENTS

| | | |
|---|---|---|
| JP | 2000277733 | 10/2000 |
| JP | 2006-173202 | 6/2006 |

* cited by examiner

*Primary Examiner* — Cathy N Lam
(74) *Attorney, Agent, or Firm* — Patterson & Sheridan, LLP

(57) ABSTRACT

A semiconductor device includes a superjunction structure. The influence of external charge on device performance is suppressed using a shield electrode, field plate electrodes, and cover electrodes in various configurations. Optional embodiments include placing an interconnection film between certain electrodes and the upper surface of the superjunction structure. Cover electrodes may also be connected to various potentials to limit the effects of external charge on device performance.

20 Claims, 9 Drawing Sheets

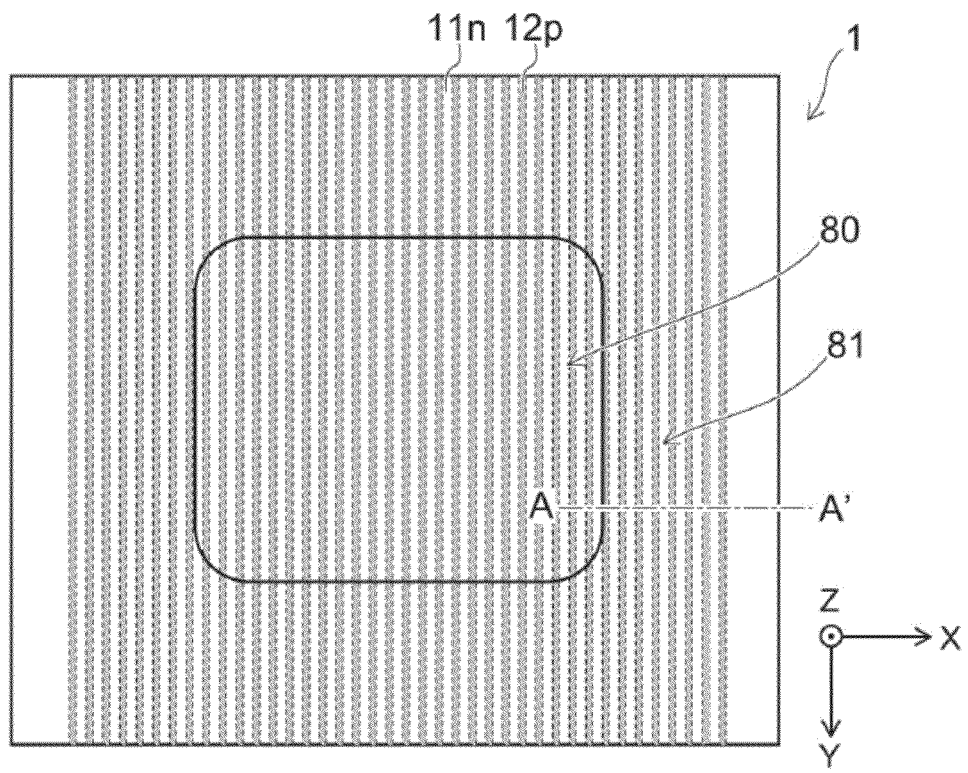

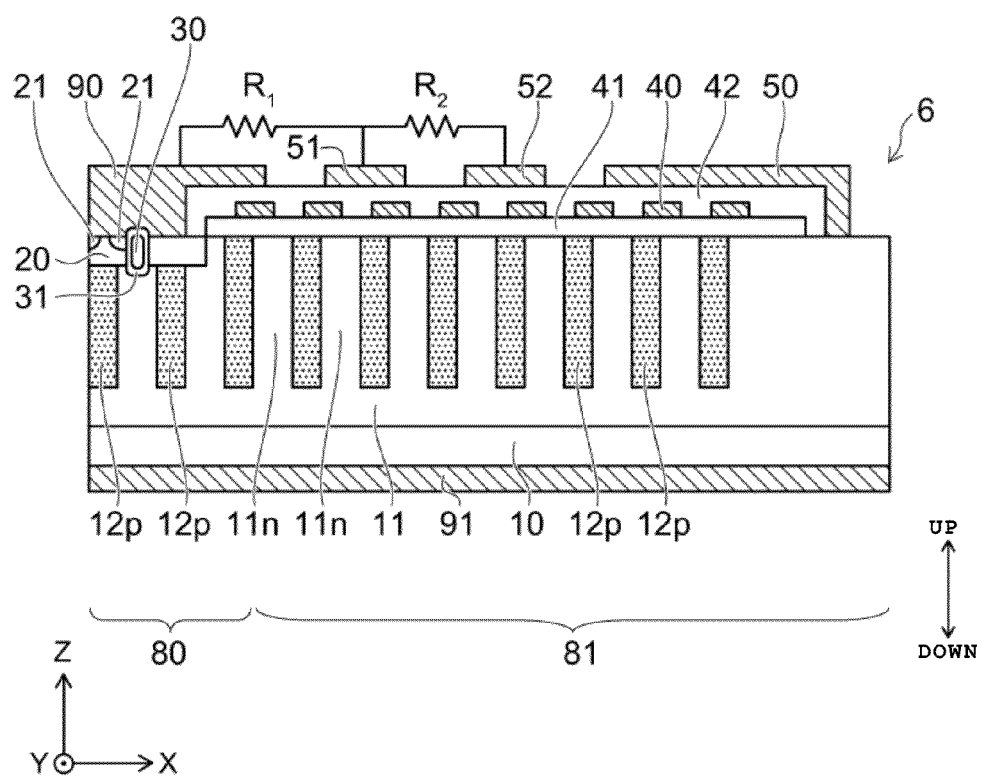

US 8,759,938 B2

SEMICONDUCTOR DEVICE

CROSS-REFERENCE TO RELATED APPLICATION

This application is based upon and claims the benefit of priority from Japanese Patent Application No. 2012-139012, filed Jun. 20, 2012; the entire contents of which are incorporated herein by reference.

FIELD

Embodiments described herein relate to a semiconductor device.

BACKGROUND

Power semiconductor devices such as Power MOSFET (Metal Oxide Semiconductor Field Effect Transistor) and IGBT (Insulated Gate Bipolar Transistor) have fast switching characteristics and reverse blocking voltage. Such devices are used widely for power conversion and control in electric appliances, communication devices, automobile motors, and other applications. Superjunction structures, which alternate p-type semiconductor regions and n-type semiconductor regions in an array within a semiconductor device have been receiving a lot of attention in order to increase efficiency and lower power consumption in these devices.

In these semiconductor chips, there are cases when superjunction structures are formed not only in the element region but also in the termination region outside of the element region. This is done to extend the depletion layer to the termination region when voltage is applied between the source and drain. With this kind of structure, the depletion region extends in to the element region and the termination region when OFF, which allows a high breakdown voltage to be maintained.

However, the high-voltage characteristic of superjunction structures presupposes that the charge quantities of each of the p-type semiconductor region and the n-type semiconductor region are properly balanced. Therefore, if each charge quantity fluctuates due to outside influence, its dependability (e.g., breakdown voltage) may be greatly reduced. For this reason, with a semiconductor chip equipped with a superjunction structure, it is necessary to sufficiently suppress the influence of charge from the outside in addition to properly preparing the charge quantity of the p-type semiconductor region and the n-type semiconductor region.

The problem that this invention tries to solve is to provide a semiconductor device with improved reliability.

DESCRIPTION OF THE DRAWINGS

FIG. 1A is a schematic plan view diagram of the superjunction structure area of a semiconductor device of a first embodiment.

FIG. 8 is a schematic cross-section diagram of a semiconductor device pertaining to a sixth embodiment.

DETAILED DESCRIPTION

In general example embodiments relate to a vertical semiconductor device that possesses an element region and a junction-termination region that surrounds the element region. The semiconductor device is equipped with a first semiconductor region of a first conductivity type placed in the element region and the junction-termination region, a second semiconductor region of the first conductivity type placed above the first semiconductor region, and plural third semiconductor regions of a second conductivity type that are arrayed (juxtaposed) in a first direction substantially perpendicular to a lamination direction of the first semiconductor region and the second semiconductor region. The lamination direction of the first and the second semiconductor region may also be referred to as the layer stacking direction and is the direction substantially perpendicular to plane of the device substrate.

Also, the semiconductor device of this example embodiment is equipped with a fourth semiconductor region of the second conductivity type placed above at least one of the third semiconductor regions of the element region, and a fifth semiconductor region of the first conductivity type placed above the fourth semiconductor region.

Also, the semiconductor device of this example embodiment is equipped with a first electrode that is in contact with the second semiconductor region, the fourth semiconductor region, and the fifth semiconductor region via a first insulating film. A second electrode is electrically connected to the fourth semiconductor region and the fifth semiconductor region; and a third electrode is electrically connected to the first semiconductor region.

Also, the semiconductor device of this example embodiment is equipped with plural fourth electrodes that are arrayed in the first direction via a second insulating film, above the plural third semiconductor regions in the junction-termination region as well as above the second semiconductor region in the junction-termination region, and a fifth electrode placed above at least one of the plural fourth electrodes via a third insulating film and is electrically connected to the third electrode.

In the following description, the common components or structures are denoted by the same legend symbols, and the duplicated descriptions may be omitted.

Embodiment 1

Figure 1B:
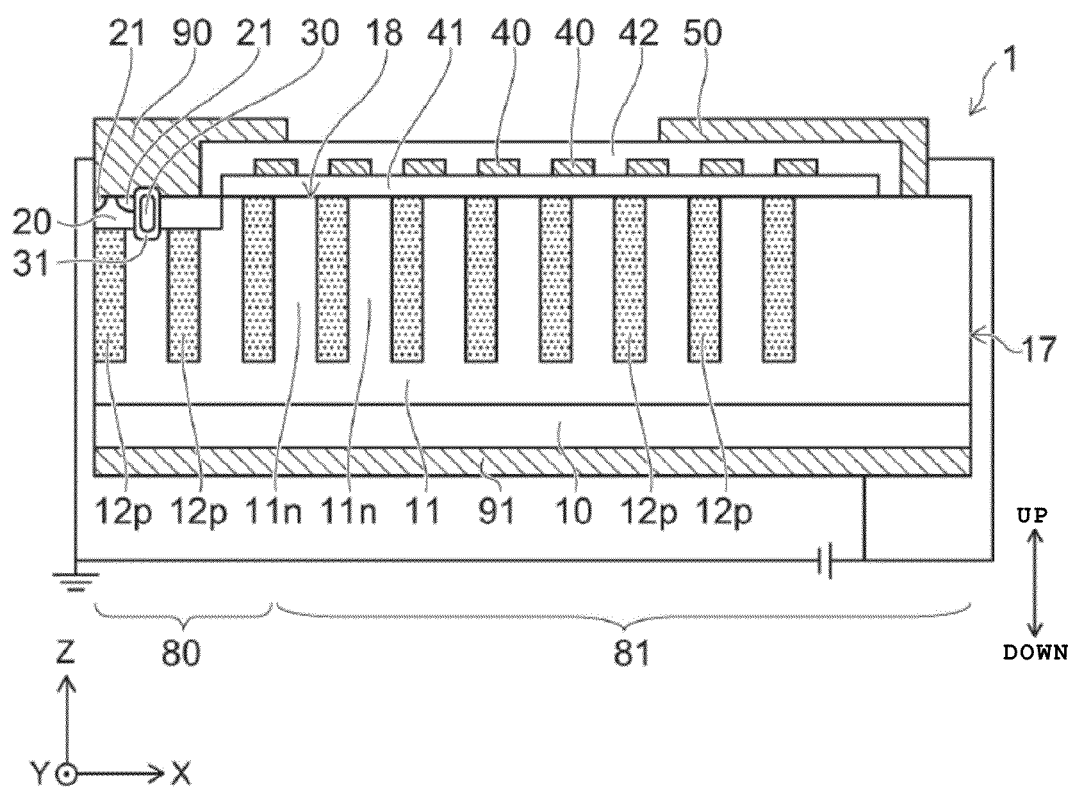
FIG. 1B is a schematic cross-section diagram of the A-A' cross-section of FIG. 1A.

FIG. 1A is a schematic plan view diagram of a superjunction structure area of the semiconductor device. FIG. 1B is a schematic cross-section diagram of the A-A' cross-section of FIG. 1A.

The semiconductor device 1 that pertains to the first embodiment possesses a lower and upper electrode structure (vertical-type) MOSFET. The semiconductor device 1 possesses an element region 80 and a junction-termination region 81 (which, henceforth, will be simply referred to as termination region 81) that is placed outside the element region 80. The element region 80 is surrounded by the termination region 81. Transistors and other device components are placed in the element region 80.

In the semiconductor device 1, at the element region 80 and the termination region 81, an n+ type drain region 10 (first semiconductor region) is formed. Above the drain region 10 is placed an n-type drift region 11 (second semiconductor region). In the drift region 11, plural p-type pillar regions 12p (third semiconductor region) are formed. The plural p-type pillar regions 12p are arrayed at set intervals in a direction (first direction—the X direction in the drawing)) that is substantially perpendicular to the laminating direction (the Z direction in the drawing) between the drain electrode 10 and the drift region 11.

Here "set intervals" may be, as an example, equally spaced intervals, but other intervals may be incorporated. Also, in the first embodiment, the portions of drift region 11 that are sandwiched between each of the plural p-type pillar regions 12p may be referred to as an n-type pillar region 11n. The semiconductor device 1 possesses a superjunction structure that has the p-type pillar regions 12p and n-type pillar regions 11n arrayed in an alternating fashion, in the X-direction. This superjunction structure is spans not only the element region 80 but also extends into the termination region 81. Also, each of the plural p-type pillar regions 12p as well as each of the plural n-type pillar regions 11n extends in the Y direction, which is substantially perpendicular to the Z direction and the X direction.

With the semiconductor device 1, in the element region 80, a p-type base region 20 (fourth semiconductor region) is placed above at least one of the plural p-type pillar regions 12p. Above the base region 20, an n+ type source region 21 (fifth semiconductor region) is placed. A gate electrode 30 (first electrode) is in contact with the drift region 11, the base region 20, and the source region 21, via a gate insulating film 31 (first insulating film). The gate electrode 30 is positioned between neighboring base regions 20. The lower end of the gate electrode 30 is positioned in the drift region 11 that is below portions of the base regions 20. In the first embodiment, an example of the gate electrode 30 with a trench gate type structure is shown, but gate electrode 30 could be a planar type structure as well without departing from this disclosure.

The source region 21 and the base region 20 are electrically connected to a source electrode 90 (second electrode). A drain electrode 91 (third electrode) is electrically connected to the drain region 10.

Also, with the semiconductor device 1, plural field plate electrodes 40 (fourth electrode) are placed above the plural p-type pillar regions 12p and above the drift region 11 (or the n-type pillar region 11n) in the termination region 81, via an insulating film 41 (second insulating film). The plural field plate electrodes 40 are arrayed in the X direction. Each of the plural field plate electrodes 40 extends in the Y direction. Each of the plural field plate electrodes 40 is placed above a junction interface between each of the plural p-type pillar regions 12p and the n-type pillar region 11n. The plural field plate electrodes 40 are covered by an insulating film 42 (third insulating film).

Above at least one of the plural field plate electrodes 40, a shield electrode 50 (fifth electrode) is placed via the insulating film 42. The shield electrode 50 encircles the element region 80 and is electrically connected to the drain electrode 91. Shield electrode 50 may also be called an Equi Potential Ring (EQP).

The shield electrode 50 is electrically connected to drain electrode 91 so the source electrode 90 must be spaced far enough away from the shield electrode that electrical shorts will not happen. Each of the plural field plate electrodes 40 placed between the shield electrode 50 and the source electrode 90 is in a state of floating potential. The potential of each of the plural field plate electrodes 40 is at a potential that is between the potentials of the shield electrode 50 and the source electrode 90.

A ground potential or a negative potential is applied to the source electrode 90, and a positive potential is applied to the drain electrode 91 and the shield electrode 50 when semiconductor device 1 is set to OFF. When the potential of gate electrode 30 becomes larger than some threshold potential while there is a voltage applied between the source electrode 90 and the drain electrode 91, electric current runs between the source electrode 90 and the drain region 10, via the drift region 11 (when ON).

The major components of the drain region 10, the drift region 11, the p-type pillar region 12p, the base region 20 and the source region 21 are formed, for example, from silicon (Si). The materials for the gate insulating film 31, the insulating film 41, and the insulating film 42 are, for example, silicon oxide ($SiO_2$). The material for the gate electrode 30 and the field plate electrode 40, are, for example, polysilicon (poly-Si). The material for the source electrode 90, the shield electrode 50, and the drain electrode 91 are, for example, metals such as aluminum (Al).

The drain region 10, the drift region 11, the p-type pillar region 12p, the base region 20, and the source region 21 each include an impurity element. For example, the impurity element of the n-type, n− type, and n+ type (first conductivity type) are phosphate (P), arsenic (As), or the like, and the impurity element of the p-type (second conductivity type) is boron (B), or the like.

Figure 2A:
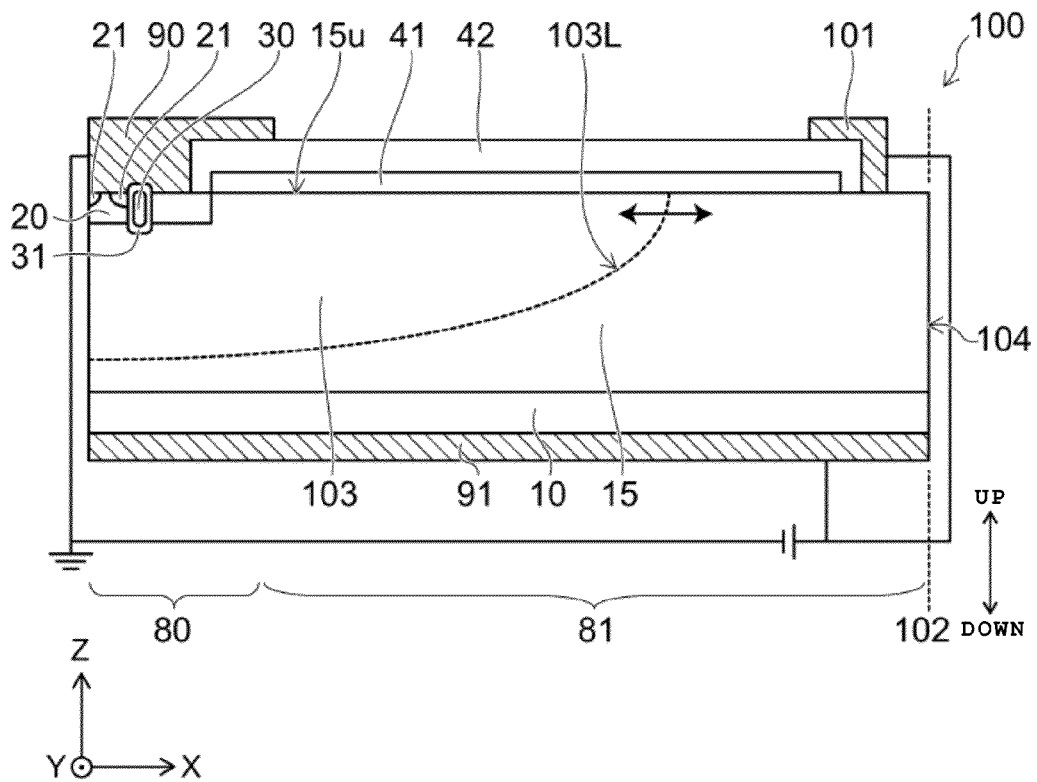
FIG. 2A is a schematic cross-section diagram of a semiconductor device.
Figure 2B:
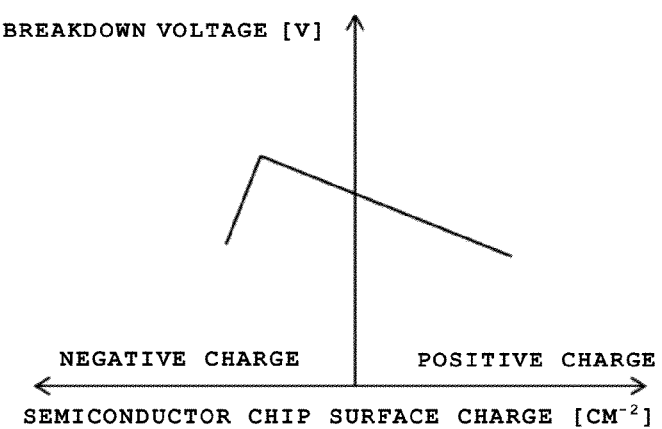
FIG. 2B shows the relationship between surface charge of a semiconductor device surface and breakdown voltage.

The function of the semiconductor device 1 according to the first embodiment will be described. In order to describe the function of the semiconductor device 1, first, the function of the semiconductor device depicted in FIG. 2A will be described. First, the function of the semiconductor device when OFF will be explained. FIG. 2A is a schematic cross-section diagram of the semiconductor device, and FIG. 2B is a schematic diagram showing the relationship between the charge of the semiconductor device surface and the breakdown voltage.

The semiconductor device 100 depicted in FIG. 2A is a semiconductor device with a lower and upper electrode structure. No superjunction structure or field plate electrode 40 previously described in relation to semiconductor device 1 are placed in the semiconductor device 100. Furthermore, in termination region 81, a field stop electrode 101 is placed rather than a shield electrode 50. The width of the field stop electrode 101 in the X direction is narrower than the width of the shield electrode 50. This field stop electrode 101 is placed with the aim of keeping the depletion layer from reaching a dicing line 102, which is the outer edge of the termination region 81 when the semiconductor device 100 is in the OFF state. Also, the drift region 15 of the semiconductor device 100 is n− type semiconductor material having a lower impurity density than the previously described drift region 11.

With the semiconductor device 100, if a high voltage (henceforth, simply high voltage application) is applied between the source electrode 90 and the drain electrode 91 in the OFF state, a charge carrier is extracted from the drift region 15, and that the drift region 15 will become depleted, and a high voltage will be maintained in the drift region 15. With semiconductor device 100, the source region 21 and the gate electrode 30 are placed only in element region 80, and on the drain region 10 side, the drain electrodes 91 are placed over the entire surface. Therefore, with the semiconductor device 100, it is necessary to maintain high breakdown voltage not only in the element region 80 but also in the termination region 81.

One cause that influences the breakdown voltage in the termination region 81 is the degree of extension of the depletion layer in the termination region 81 during high voltage application. For example, if a depletion layer 103 reaches the dicing line 102 during high voltage application, the breakdown voltage of the semiconductor device 100 could fluctuate or a leak could occur. Therefore, it is necessary to design the termination region so that the depletion layer 103 does not reach the dicing line 102 during high voltage application.

One way to achieve this goal is to increase the width of the termination region 81 in the X direction. By making the width of the termination region 81 wider in the X direction, it becomes more difficult for the depletion layer 103 to reach the dicing line 102. However, making the width of the termination region 81 wider means enlarging the semiconductor device. Also, generally as the semiconductor device becomes larger, the manufacturing yield rate goes down. Therefore, regarding the width of the termination region 81, it is necessary to set the width of the termination region 81 to the smallest value that is sufficient for both the desired applied voltage and productivity.

Also, it is possible to inhibit the depletion layer 103 from reaching the dicing line 102 by placing field stop electrode 101 in an appropriate location. However, as a possible complication, the surface of the termination region 81 is covered by the insulating films 41 and 42. Also, in an actual production device, the surface of the termination region 81 may also be covered by a protection film (polyimide film, silicon nitride (SiN) film, or the like) and/or an encapsulating resin material.

In general, there are ionic components in such insulating materials. For example, if the device is subjected to high-temperature and humid conditions, the encapsulating resin will likely absorb moisture from the atmosphere, and various ions such as hydrogen ions will remain in the encapsulating resin. These ionic components may move within insulating materials during high voltage application. When these ionic components (hereinafter, external charge) move within the insulating materials during high voltage application, this will end up affecting the electric field distribution in the terminal region 81 during high voltage application. This is because the ionic charge that is included in the insulating material acts on the electric field at the termination region 81 due to capacitance coupling.

For example, if the same high voltage is applied between the source and drain several different times, an extension 103L of the depletion layer 103 will, as shown by the arrow in FIG. 2A, move to one side or the other of the element region 80 depending on external charge present when the high voltage is applied. If the external charge varies due to movement of ionic components in the layers above the termination region, the position of the extension 103L of the depletion layer 103 will also fluctuate, and the breakdown voltage of the semiconductor device becomes unstable.

The relationship between the charge of the surface of the semiconductor device and the breakdown voltage is shown in FIG. 2B. The charge of the surface of the semiconductor device means, for example, the charge near an upper surface 15u of the drift region 15 of the semiconductor device 100. As can be seen from FIG. 2B, when the charge of the surface of the semiconductor device transitions to the positive charge side or the negative charge side, the breakdown voltage (V) of the semiconductor device fluctuates significantly. In this way, the breakdown voltage of the semiconductor device is susceptible to influence from charges in external materials (for example, the insulating layer, the protection film, the encapsulating resin, etc).

Therefore, designing the width of the termination region 81 to an optimum value for the desired applied voltage and productivity, or simply placing a field stop electrode 101, must account for this fluctuation and this will place limits regarding possible improvements in the breakdown voltage.

In a semiconductor device equipped with the superjunction structure, it becomes more difficult to design the termination region to consider the influence of the charge on the surface of the device. This is because, with a superjunction structure, it is assumed that the charge quantities of each of the n-type pillar region 11n and the p-type pillar region 12p are prepared in a well-balanced manner. For example, if the charge quantity of one the pillar regions fluctuates due to influence from an external charge, the breakdown voltage of the semiconductor device equipped with a superjunction structure may fluctuate greatly.

With the semiconductor device 1 pertaining to the first embodiment, on top of the preparation of the charge quantities of each of the n-type pillar region 11n and the p-type pillar region 12p, the influence of the charge on the outer layer of the superjunction structure is kept at a minimum.

Figure 3:
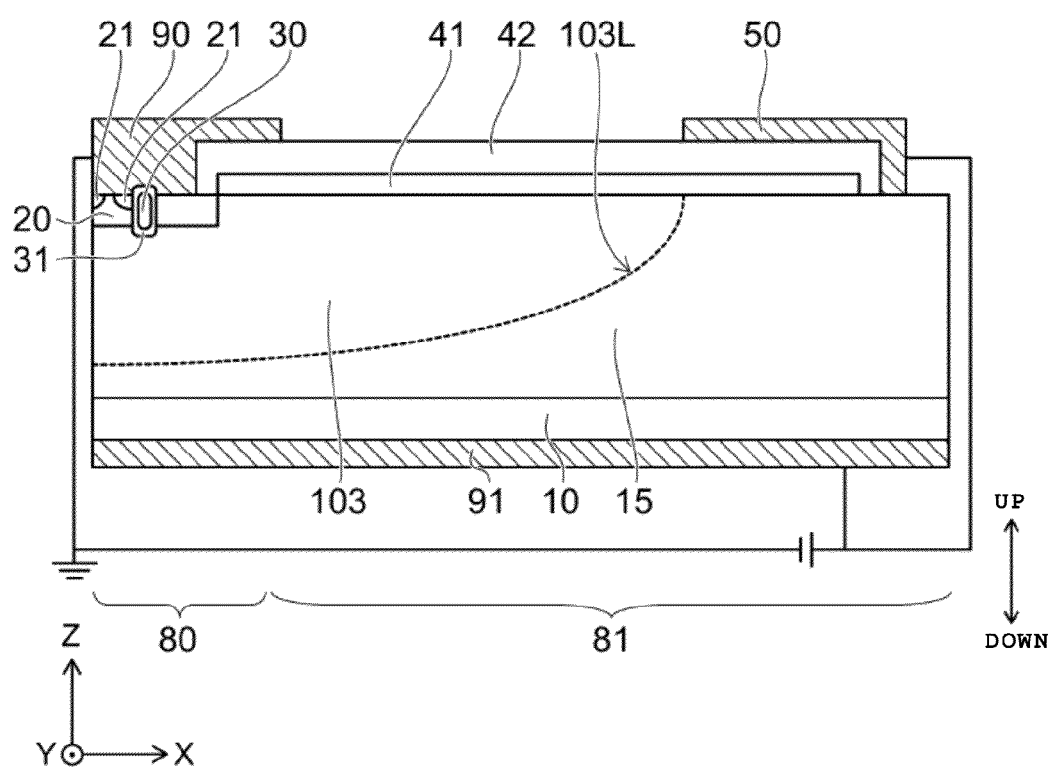
FIG. 3 is a schematic cross-section diagram describing the function of a semiconductor device.

FIG. 3 is a schematic cross-section diagram describing the function of a semiconductor device having a shield electrode 50. For example, with the semiconductor device 100 equipped with a shield electrode 50, the effect of external charge on the surface electric field at termination region 81 is shielded by the shield electrode 50. In this way, the shield electrode 50 reduces the fluctuation in the extension of the depletion layer 103 and the extension 103L of the depletion layer 103 becomes less prone to fluctuation. For example, as shown in FIG. 3, the extension 103L of the depletion layer 103 is fixed below the shield electrode 50.

As for the semiconductor device 1, the shield electrode 50 extends from the outer edge 17 of the semiconductor device 1 in the direction of the element region 80. The width of the shield electrode 50 is prepared so that it covers at least one of the plural field plate electrodes 40 that are arrayed from the outer edge 17 side of the shield electrode 50.

That is, when the semiconductor device 1 is seen from above (the Z direction), there is not a space visible between the shield electrode 50 and the field plate electrode 40 that is positioned in the outer most side of the termination region 81. By placing a shield electrode 50 in such a manner, the breakdown voltage of the semiconductor device is made more stable by suppressing the fluctuation in the extension of the depletion layer.

Also, since semiconductor device 1 is equipped with not only shield electrode 50 but also plural field plate electrodes 40, additional shielding from external charge is provided by the field plate electrodes. With the plural field plate electrodes 40, the above mentioned effect of the external charge on the surface electric field is reduced, and the fluctuation of the extension of the depletion layer is suppressed. For example, the p-type pillar region 12p and the n-type pillar region 11n near surface 18 of the superjunction structure becomes less prone to influence from external charge. Through this, the influence of charge at the outer layer of the superjunction structure is reduced to a minimum.

Also, by placing plural field plate electrodes 40, in termination region 81, the depletion layer will extend from surface 18 of the superjunction structure to the drain electrode 91 side during high voltage application. Each of the plural field plate electrodes 40 is positioned above a junction interface of the p-type pillar region 12p and the n-type pillar region 11n.

Therefore, the depletion layer connects efficiently with the depletion layer at the junction interface between the p-type pillar region 12p and the n-type pillar region 11n. That is, in the termination region 81, the depletion at the p-type pillar region 12p and the n-type pillar region 11n is boosted. This lessens the strength of the electric field that occurs near the junction interface of the p-type pillar region 12p and the n-type pillar region 11n. As a result, the electric field of the surface layer of the superjunction structure in the termination region 81 is lessened, and the breakdown voltage in the termination region 81 is further stabilized.

If a potential over a threshold amount is applied to the gate electrode 30 in a state where a high voltage is applied between the source electrode 90 and the drain electrode 91, a channel is formed at the base region 20 along the interface between base region 20 and drift region 11, and a current runs between the source electrode 90 and the drain electrode 91 via the drift region 11. That is to say, the semiconductor device 1 becomes the ON state.

Embodiment 2

Figure 4:
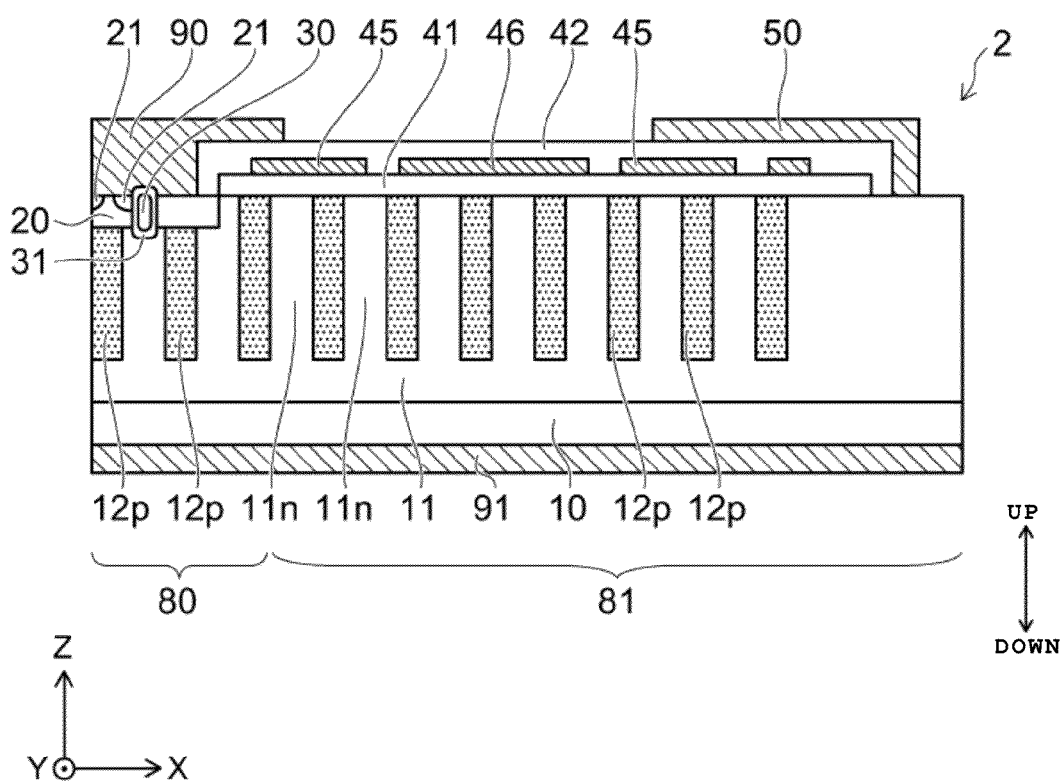
FIG. 4 is a schematic cross-section diagram of a semiconductor device pertaining to a second embodiment.

FIG. 4 is a schematic cross-section diagram of a semiconductor device pertaining to a second embodiment.

The basic structure of semiconductor device 2 pertaining to the second embodiment is the same as that in the semiconductor device 1. However, in semiconductor device 2, at least one of the plural field plate electrodes is installed above at least two of the plural p-type pillar regions 12p. For example, a field plate electrode 45 is depicted installed above two p-type pillar regions 12p. Also, a field plate electrode 46 is depicted installed above three p-type pillar regions 12p.

When a single field plate electrode covers the surface above multiple p-type pillar regions, the surface cover ratio of the superjunction structure will further increase. Increased surface coverage by field plate electrodes will further screen the surface electric field of termination 81 from external charge. As a result, the breakdown voltage becomes more stable, providing a semiconductor device with a higher reliability.

Embodiment 3

Figure 5:
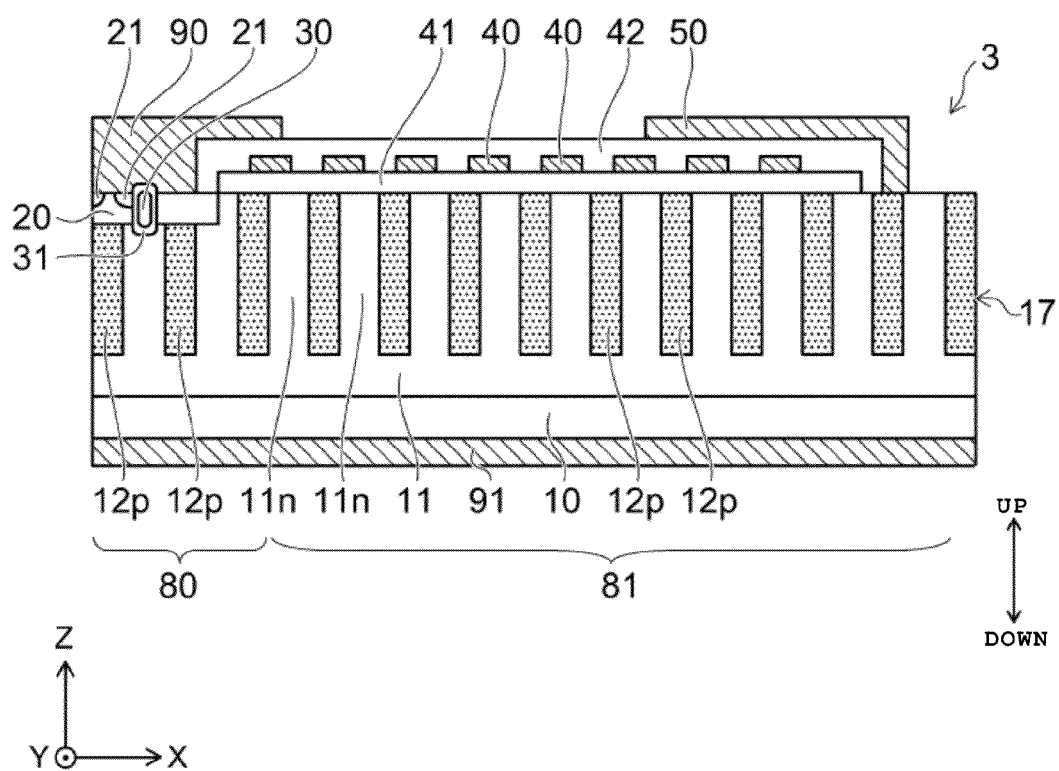
FIG. 5 is a schematic cross-section diagram of a semiconductor device pertaining to a third embodiment.

FIG. 5 is a schematic cross-section diagram of a semiconductor device pertaining to a third embodiment.

The basic structure of a semiconductor device 3 pertaining to the third embodiment is the same as semiconductor device 1. However, in the semiconductor device 3, a structure (a superjunction structure) that arrays plural p-type pillar regions 12p within drift region 11 spans from outer edge 17 of the termination region 81 to the element region 80.

As for the superjunction structure, it is possible to extend the depletion layer from the junction interface between the p-type pillar region 12p and the n-type pillar region 11n. Since the p-type pillar region 12p and the n-type pillar region 11n are arrayed in an alternating fashion, the p-type pillar region 12p is sandwiched by a pair of n-type pillar regions 11n and an n-type pillar region 11n is sandwiched by a pair of p-type pillar regions 12p. Due to this fact, if this junction interface depletion layer extends at least half the length of the width between each of the pillar regions (12p, 11n) (the width in the X direction), it is possible for the depletion layer to extend throughout the superjunction structure.

However, in a structure where the superjunction structure does not extend the full width of the termination region (i.e., the array of p-type pillar regions 12p does not reach to outer edge 17) in the termination region 81, it will be a structure where the drift region 11 (n-type pillar region 11n) that is positioned between the p-type pillar region 12p closest to the outer edge 17 and the outer edge 17 will not be sandwiched by p-type pillar regions 12p. In this kind of structure, there is a possibility that the depletion layer will not sufficiently extend in the drift region 11 that is positioned between the p-type pillar region 12p closest to the outer edge 17 and the outer edge 17. If the depletion layer does not extend sufficiently, there will be parts where the electric field may be strong locally, which may cause the device breakdown voltage to be lowered.

But with semiconductor device 3, the superjunction structure extends from the element region 80 to the outer edge 17 of the termination region 81. With this kind of structure, it is possible to expand the depletion layer to near the outer edge 17 of the termination region 81, and the strength of the electric field will be lessened according to how much this depletion layer expands. As a result, the breakdown voltage will further stabilize.

Embodiment 4

Figure 6:
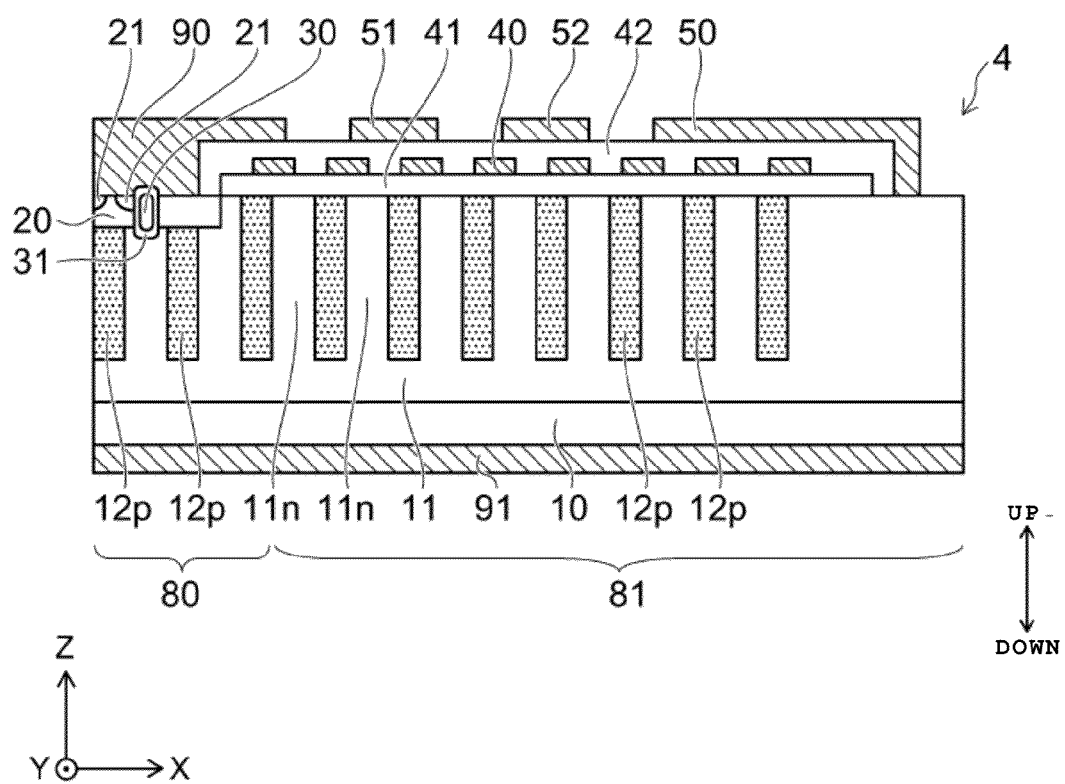
FIG. 6 is a schematic cross-section diagram of a semiconductor device pertaining to a fourth embodiment.

FIG. 6 is a schematic cross-section diagram of a semiconductor device pertaining to a fourth embodiment.

The basic structure of a semiconductor device 4 pertaining to the fourth embodiment is the same as that in semiconductor device 1. However, semiconductor device 4 is further equipped with electrodes 51, 52 (sixth electrode). The electrodes 51, 52 may collectively be called the cover electrode. The electrodes 51, 52 are placed above the plural field plate electrodes 40 that are positioned between the source electrode 90 and the shield electrode 50, via the insulating film 42. The materials for the electrodes 51, 52 are the same as that for the source electrode 90. The potential for each of the electrodes 51, 52 is in a floating state.

According to such a structure, the effect of the above mentioned external charge to the Si surface electric field is shielded, not only by the plural field plate electrodes 40 but also by the electrodes 51, 52. Therefore, the breakdown voltage is further stabilized and a more reliable semiconductor device is provided.

Embodiment 5

Figure 7:
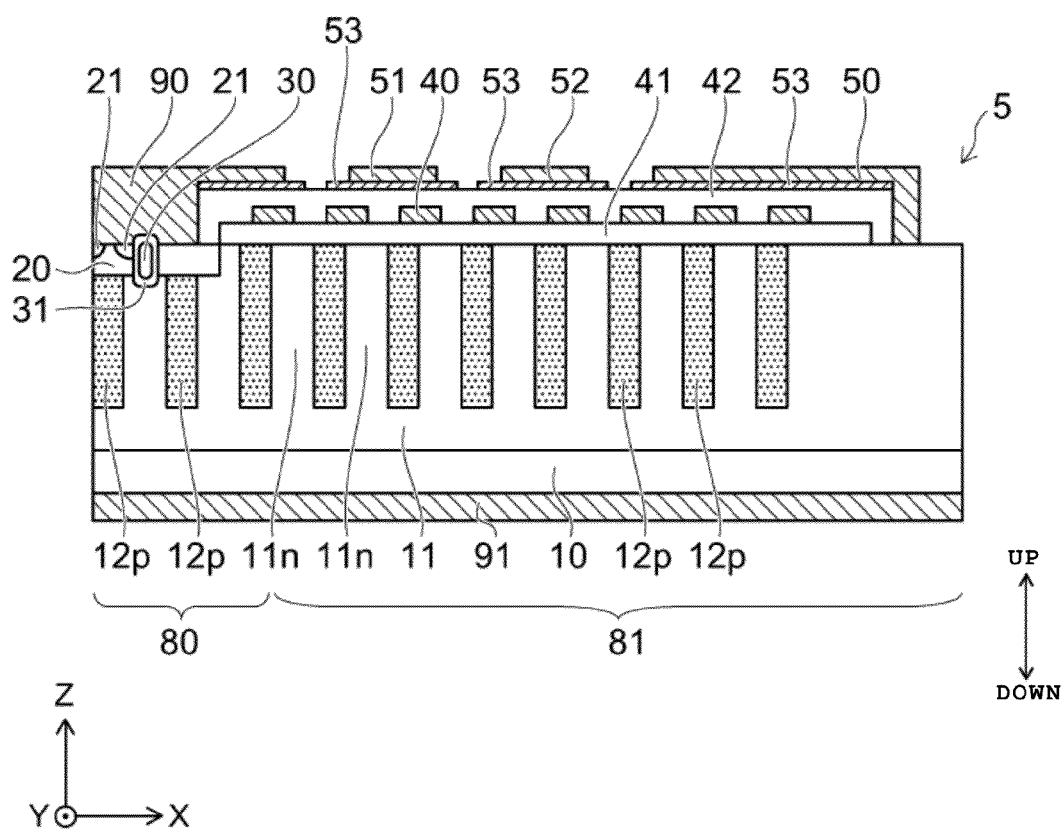
FIG. 7 is a schematic cross-section diagram of a semiconductor device pertaining to a fifth embodiment.

FIG. 7 is a schematic cross-section diagram of a semiconductor device pertaining to a fifth embodiment.

The basic structure of semiconductor device 5 pertaining to the fifth embodiment is the same as that in the semiconductor device 4; however, semiconductor device 5 is also equipped with an interconnection layer 53. The interconnection layer 53 is placed between the cover electrode (electrodes 51, 52) and insulating film 42. Also, interconnection layer 53 is placed between source electrode 90 and insulating film 42, as well as, between shield electrode 50 and insulating film 42. With the semiconductor device 5, the surface coverage ratio of termination region 81 is further increased.

The interconnection layer 53 is, for example, a monolayer film that includes either titanium (Ti) or tungsten (W), or a film that includes at least one of either titanium (Ti) or tungsten (W). The width of the interconnection layer 53 in the X direction is wider than each of electrodes 51, 52 in the X direction.

With this kind of structure, the effects of external charge on the Si surface electric field are reduced, due to the increase in the shield cover ratio on the Si surface. External charge is shielded not only by the plural field plate electrodes 40, the electrodes 51, 52, but also by the interconnection layer 53. As a result, the fluctuation in the extension of the depletion layer is suppressed. Therefore, the breakdown voltage is further stabilized, and a more reliable semiconductor device is provided.

Embodiment 6

FIG. 8 is a schematic cross-section diagram of a semiconductor device pertaining to a sixth embodiment.

The basic structure of semiconductor device 6 pertaining to the sixth embodiment is the same as that in semiconductor device 4. However, in semiconductor device 6, each of the electrodes 51, 52 is electrically connected to the source electrode 90 via a resistor. For example, the electrode 51 is connected to the source electrode 90 via a resistor R1, and the electrode 52 is connected to the electrode 51 via R2. In this embodiment, there is no need to provide specific or separate resistor structures, rather the required resistances may be provided by use of a narrow lead line (not shown in the diagram) to make the electrical connections between the source electrode and the cover electrode. As an alternative, each of the electrodes 51, 52 may also be electrically connected to the shield electrode 50 via a resistor.

With this kind of structure, the potential of each of the electrodes 51, 52 becomes a fixed potential. Since the termination region 81 will be covered by the electrodes 51, 52 that are fixed potential, it becomes less prone to influence from external charge. Therefore, the breakdown voltage becomes more stabilized, and a more reliable semiconductor device is provided.

The example semiconductor device for each embodiment has been a MOSFET with a lower and upper electrode structure, but the semiconductor device may also be an IGBT (insulated gate bipolar transistor) that has a p+ type layer between the drain electrode 91 and the drift region 11. In this case, the source is called an emitter, and the drain is called a collector.

Embodiments of a highly reliable semiconductor device have been described in reference to specific examples; however, the disclosure is not limited to these specific examples. That is to say, modifications in the design of these specific examples which may be made by a person skilled in the art are also encompassed in the scope of this disclosure. Various elements as well as their placements, materials, conditions, shapes, and sizes that are described for each specific example may be accordingly changed without being limited to those that are specifically illustrated.

Also, the elements that are equipped by the each embodiment may be combined, as long as it is technically possible, and these combinations are also encompassed in the scope of the embodiments as long as they include the characteristics of the embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
an element region;
a junction-termination region, the junction-termination region surrounding the element region; a first semiconductor region of a first conductivity type that is placed in the element region and the junction-termination region;
a second semiconductor region of the first conductivity type that is placed above the first semiconductor region;
a plurality of pillars of a second conductivity type, the plurality of pillars forming an array of pillars, the array spanning at least portions of the element region and the junction-termination region in a first direction, the pillars extending from an upper surface of the second semiconductor region into the second semiconductor region in a direction substantially perpendicular to a plane containing the first semiconductor region;
a plurality of field plate electrodes that are arrayed in the first direction, the plurality of field plate electrodes above the plurality of pillars, the plurality of field plate electrodes separated from the plurality of pillars by an insulating film; and
a shield electrode that is electrically connected to a drain potential, the shield electrode located above at least one of the plurality of field plate electrodes.

2. The semiconductor device of claim 1, wherein each field plate electrode is located above a junction interface, the junction interfaces formed between each of the plurality of pillars and the second semiconductor region.

3. The semiconductor device of claim 1, wherein a single field plate electrode is located above more than one pillar.

4. The semiconductor device of claim 1, wherein the array of pillars spans the entire width of the junction-termination region.

5. The semiconductor device of claim 1, further comprising a cover electrode above one or more field plate electrodes in the junction-termination region.

6. The semiconductor device of claim 5, wherein the cover electrode is electrically connected to the shield electrode.

7. The semiconductor device of claim 5, further comprising a plurality of cover electrodes.

8. The semiconductor device of claim 5, further comprising an interconnection layer located between the cover electrode and the plurality of field plate electrodes.

9. The semiconductor device of claim 8, wherein the interconnection layer is wider than the cover electrode.

10. The semiconductor device of claim 8, wherein the interconnection layer is also located between the shield electrode and the field plate electrodes.

11. The semiconductor device of claim 8, wherein the interconnection layer comprises at least one of tungsten or titanium.

12. The semiconductor device of claim 8, wherein the interconnection layer is a monolayer film.

13. A semiconductor device, comprising:
an element region;
a junction-termination region, the junction-termination region surrounding the element region;
a first semiconductor region of a first conductivity type that is placed in the element region and the junction-termination region;
a second semiconductor region of the first conductivity type that is placed above the first semiconductor region;
a plurality of third semiconductor regions of a second conductivity type that is inserted into the second semiconductor region, and is juxtaposed in a first direction that is nearly perpendicular to a lamination direction of the first semiconductor region and the second semiconductor region;
a fourth semiconductor region of the second conductivity type that is placed above at least one of the plurality of third semiconductor regions in the element region;

a fifth semiconductor region of the first conductivity type that is placed above the fourth semiconductor region;

a first electrode that is in contact with the second semiconductor region, the fourth semiconductor region, and the fifth semiconductor region, via a first insulating film;

a second electrode that is electrically connected to the fourth semiconductor region and the fifth semiconductor region;

a third electrode that is electrically connected to the first semiconductor region;

a plurality of fourth electrodes that are juxtaposed in the first direction, above the plurality of third semiconductor regions in the junction-termination region and above the second semiconductor region in the junction-termination region, via a second insulating film; and a fifth electrode that is electrically connected to the third electrode, and is placed above at least one of the plurality of fourth electrodes via a third insulating film.

14. The semiconductor device according to claim 13, wherein each of the plurality of fourth electrodes is placed above the junction interface of each of the plurality of third semiconductor regions and the second semiconductor region that is sandwiched by each of the plurality of third semiconductor regions.

15. The semiconductor device according to claim 13, wherein at least one of the plurality of fourth electrodes is installed above at least two of the plurality of third semiconductor regions.

16. The semiconductor device according to claim 13, wherein the plurality of third semiconductor regions in the second semiconductor region extends to an outer edge of the junction-termination region.

17. The semiconductor device according to claim 13, further comprising:

a plurality of sixth electrodes placed between the second electrode and the fifth electrode and above the plurality of fourth electrodes, via the third insulating film.

18. The semiconductor device according to claim 17, further comprising:

an interconnection layer that is placed between each of the plurality of sixth electrodes and the third insulating film, wherein the width of the interconnection layer in the first direction is wider than the width of each of the plurality of sixth electrodes in the first direction.

19. The semiconductor device according to claim 17, wherein each of the plurality of sixth electrodes is electrically connected to the second electrode or the fifth electrode.

20. A semiconductor device, comprising:

an element region;

a junction-termination region, the junction-termination region surrounding the element region;

a first semiconductor region of a first conductivity type that is placed in the element region and the junction-termination region;

a second semiconductor region of the first conductivity type that is placed above the first semiconductor region;

a plurality of pillars of a second conductivity type, the plurality of pillars forming an array of pillars, the array spanning at least portions of the element region and the junction-termination region in a first direction, the pillars extending from an upper surface of the second semiconductor region into the second semiconductor region in a direction substantially perpendicular to a plane containing the first semiconductor region;

a plurality of field plate electrodes that are arrayed in the first direction, the plurality of field plate electrodes above the plurality of pillars, the plurality of field plate electrodes separated from the plurality of pillars by an insulating film;

a shield electrode that is electrically connected to a drain electrode, the shield electrode located above at least one of the plurality of field plate electrodes;

a plurality of cover electrodes, the cover electrodes located above the field plate electrodes in the junction-termination region; and an interconnection layer, the interconnection layer located below each cover electrode;

wherein the array of pillars spans the entire width of the junction-termination region, the interconnection layer is wider than each cover electrode, and the cover electrodes are electrically connected to a source electrode or the shield electrode.

* * * * *